United States Patent [19]

Bucknam

[11] Patent Number: 4,923,406

[45] Date of Patent: May 8, 1990

[54] SPINDLE MOTOR FLEX CABLE

[75] Inventor: Neil E. Bucknam, Simi Valley, Calif.

[73] Assignee: Magnetic Peripherals Inc., Minnetonka, Minn.

[21] Appl. No.: 272,450

[22] Filed: Nov. 17, 1988

[51] Int. Cl.[5] .............................................. H01R 9/09
[52] U.S. Cl. ..................................... 439/77; 361/398
[58] Field of Search .................. 439/67, 77, 492–499; 361/398; 360/102, 103, 104

[56] References Cited

U.S. PATENT DOCUMENTS

| 3,573,345 | 4/1971 | Devries | 439/493 |
| 4,302,065 | 11/1981 | Taylor | 174/88 R |
| 4,756,940 | 7/1988 | Payne et al. | 361/398 |

OTHER PUBLICATIONS

IBM Bulletin, Dunmar, vol. 20, No. 5, p. 1984, 10–1977.

Primary Examiner—Neil Abrams
Attorney, Agent, or Firm—Kelly, Bauersfeld & Lowry

[57] ABSTRACT

An improved spindle motor flex cable and related mounting arrangement are provided for use in a computer disk drive unit to couple a disk drive spindle motor to associated drive electronics. The flex cable comprises a flexible ribbon base with multiple conductors at one side thereof, wherein the flex cable is supported on a substantially sealed disk drive housing with the conductor side presented generally toward the housing. An inboard end segment of the flex cable is folded back upon itself for outward exposure of inboard conductor ends to permit facilitated connection as by soldering to spindle motor leads protruding from the housing. An outboard end segment of the flex cable extends beyond a side margin of the disk drive housing to expose outboard ends of the conductors for connection as by soldering to a connector fitting oriented to face away from the housing for easy plug-in connection or the like to drive electronics located, for example, an adjacent circuit board.

5 Claims, 2 Drawing Sheets 4,923,406

SPINDLE MOTOR FLEX CABLE

BACKGROUND OF THE INVENTION

This invention relates generally to improvements in disk drive units of the general type used in modern microcomputers such as personal and desk top computers and the like. More particularly, this invention relates to an improved apparatus and method for coupling a disk drive spindle motor of a disk drive unit to associated drive electronics mounted typically on an adjacent circuit board.

Disk drive units in general are known in the art for use in modern microcomputers such as personal and desk top computers and the like. In one popular form, such disk drive units comprise a so-called Winchester disk drive having one or more rotatably driven memory storage disks mounted within a substantially sealed disk drive housing along with one or more related electromagnetic heads for reading and writing data on appropriately prepared disk surfaces. A disk drive unit of this type, sometimes referred to as a "hard" or "fixed" disk, is normally available as a compact package with the sealed housing on a rigid chassis or frame together with a circuit board carrying the necessary drive electronics for interfacing with other components of a computer system. In this regard, the disk drive unit requires a power connector plug for supplying electrical power to the drive electronics on the circuit board, together with appropriate connector fittings or the like for coupling the drive electronics with a suitable spindle motor for controlled rotational driving of the memory storage disks. In addition, one or more interface connectors are normally provided for coupling the drive electronics to the computer system, such as a main system controller which supplies appropriate commands to the disk drive unit for reading and/or writing data.

In the past, assembly of a fixed disk drive unit in combination with an associated circuit board with drive electronics thereon has been a relatively difficult task requiring considerable manual labor and attention. More particularly, as one example, the spindle motor for the disk drive unit is commonly mounted within the substantially sealed disk drive housing and is designed for multiphase dc operation such that a group or bundle of spindle motor leads must be individually connected as by soldering or the like to the drive electronics on the circuit board. These spindle motor leads protrude from the sealed housing typically at the underside thereof and are normally soldered to respective terminals of a connector fitting adapted for plug-in engagement with a mating fitting mounted on the circuit board. Alternately, in some cases, the spindle motor leads may be soldered to a multiconductor cable which is coupled in turn to the associated connector fitting. In either case, however, connection of the spindle motor leads to the drive electronics has required intensive manual effort to result in relatively slow and costly assembly of the disk drive unit.

There exists, therefore, a significant need for an improved apparatus and related method for coupling the spindle motor leads of a disk drive spindle motor to the associated drive electronics, wherein the improved apparatus and method provide for simplified and faster assembly of a disk drive unit by use of methods conducive to automated assembly processes. The present invention fulfills these needs and provides further related advantages.

SUMMARY OF THE INVENTION

In accordance with the invention, an improved spindle motor flex cable is provided for use in a disk drive unit of the type used, for example, in microcomputers such as personal and desk top computers and the like. The improved spindle motor flex cable, and its related installation method, provides for facilitated coupling of a disk drive spindle motor to associated drive electronics mounted typically on a circuit board forming a portion of the disk drive unit. The flex cable is configured for ease of connection to a plurality of spindle motor leads and to a connector fitting adapted for plug-in connection or the like with the drive electronics.

In the preferred form of the invention, the improved spindle motor flex cable comprises a flexible ribbon cable base forming a substrate for a plurality of conductors applied generally to one side thereof. The flex cable is supported relative to a substantially sealed disk drive housing of the disk drive unit with the conductor side presented generally toward the housing. With this orientation, an outboard end segment of the flex cable disposed beyond one side margin of the disk drive housing is readily accessible at the conductor side for solder mounting or the like of a suitable connector fitting having means facing away from the housing for plug-in connection or the like with a mating fitting coupled to the drive electronics. In a typical disk drive unit, the flex cable is supported at the underside of the disk drive housing for upward exposure of the conductor side at the outboard end segment, thereby permitting installation of the connector fitting to face downwardly for engaging the mating fitting on an underlying circuit board.

An inboard end segment of the flex cable is folded back upon itself to expose inboard ends of the conductors for easy access and connection to the spindle motor leads. More specifically, the inboard end segment is folded back to reorient the inboard conductors ends in a position presented away from the disk drive housing. These exposed conductor ends are easily accessed during assembly of the disk drive unit for connection to the spindle motor leads by manual or automated soldering processes or the like.

In accordance with further aspects of the invention, the disk drive housing beneficially includes locating means cooperable with the flex cable for permitting accurate and rapid mounting of the flex cable onto the housing. A preferred locating means comprises a recessed seat for receiving a portion of the flex cable in a predetermined position relative to the spindle motor leads. Adhesive means or the like and/or guide posts registerable into ports formed in the flex cable may be provided for securely anchoring the flex cable in the desired position.

Other features and advantages of the present invention will become more apparent from the following detailed description, taken in conjunction with the accompanying drawings which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENT

Figure 1:
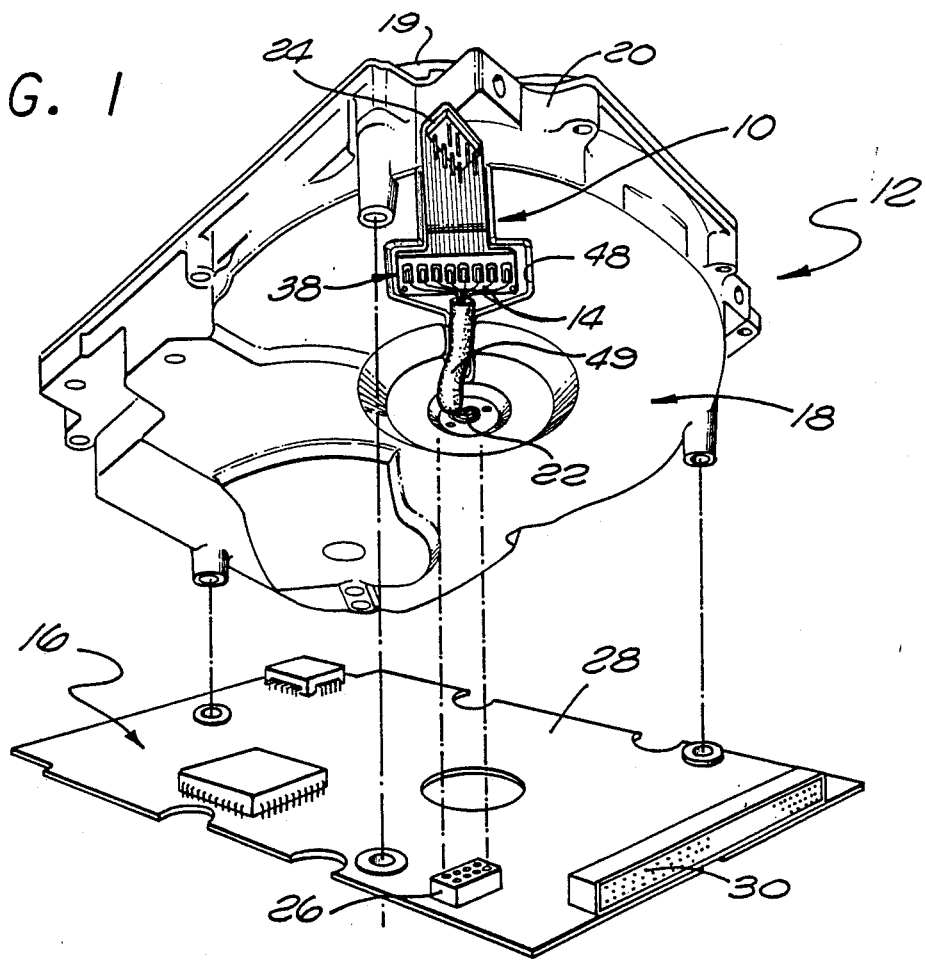
FIG. 1 is an exploded perspective view illustrating portions of a disk drive unit including a spindle motor flex cable embodying the novel features of the invention.

As shown in the exemplary drawings, an improved spindle motor flex cable referred to generally by the reference numeral 10 is provided for use in a disk drive unit 12 of the type used in modern microcomputers and the like. The spindle motor flex cable 10 provides a relatively simple, compact and economical component geometried for facilitated connection of a plurality of spindle motor leads 14 to drive electronics identified generally in FIG. 1 by the reference numeral 16. Importantly, the spindle motor flex cable 10 of the present invention is adapted for such facilitated connection through manual or automated means, as will be described.

The illustrative disk drive unit 12 has a generally standard construction known in the computer industry to include a substantially sealed disk drive housing 18. This housing 18 normally comprises a mating pair of housing sections 19 and 20 shaped to encase one or more memory storage disks (not shown). The disk or disks are rotatably supported within the housing 18 by a disk drive spindle motor 22 for operative association with one or more electromagnetic heads (also not shown) utilized to read and/or write data, all in a manner known to those skilled in the art. The spindle motor conventionally includes a group or bundle of the spindle motor leads 14 which protrude from the disk drive housing 18 through a port or the like at one end of the spindle motor 22. These spindle motor leads 14 are electrically coupled to appropriate individual terminals of a connector fitting 24 adapted for simple plug-in connection or the like with a mating fitting 26 mounted on a circuit board 28 or the like. The circuit board 28 provides a convenient mounting substrate for the drive electronics 16 required to rotatably drive the spindle motor 22 and to operate other components of the disk drive unit 12. In this regard, the circuit board 28 is normally assembled with the disk drive housing 18 to form the disk drive unit 12, with one or more interface connectors 30 being additionally provided for connection to other computer system components such as a main controller of a central processor unit (also not shown).

For further construction details regarding a preferred disk drive unit of the type shown in FIG. 1, see U.S. applications Ser. No. 173,619, filed Mar. 25, 1988, and entitled DISK DRIVE SPINDLE MOTOR, and Ser. No. 174,702, filed Mar. 29, 1988, and entitled DISK DRIVE UNIT, both of which are incorporated by reference herein.

The spindle motor flex cable 10 of the present invention, in accordance with the illustrative drawings, comprises a short and substantially flat segment of flexible ribbon cable adapted for facilitated connection as by soldering or the like to the spindle motor leads 14 and to the connector fitting 24. More specifically, the flex cable 10 comprises a flexible cable base 32 of a conventional ribbon cable insulative substrate material such as a polyimide film of the type marketed under the trademark Kapton by E. I. DuPont de Nemours and Company, Wilmington, Delaware. One side of the cable base 32 carries a plurality of individual conductors 34 which may be applied according to known processes to extend from one end of the cable base to the other. A thin film cover layer is normally applied over the conductors 34 to electrically insulate the conductors from the surrounding environment. However, opposite ends of the conductors 34 are exposed through the base or cover layer for connection as by soldering to the spindle motor leads 14 and the connector fitting 24. An intermediate fold 36 may be provided along the length of the flex cable 10 to accommodate longitudinal extension or retraction to suit a particular installation geometry.

Figure 2:
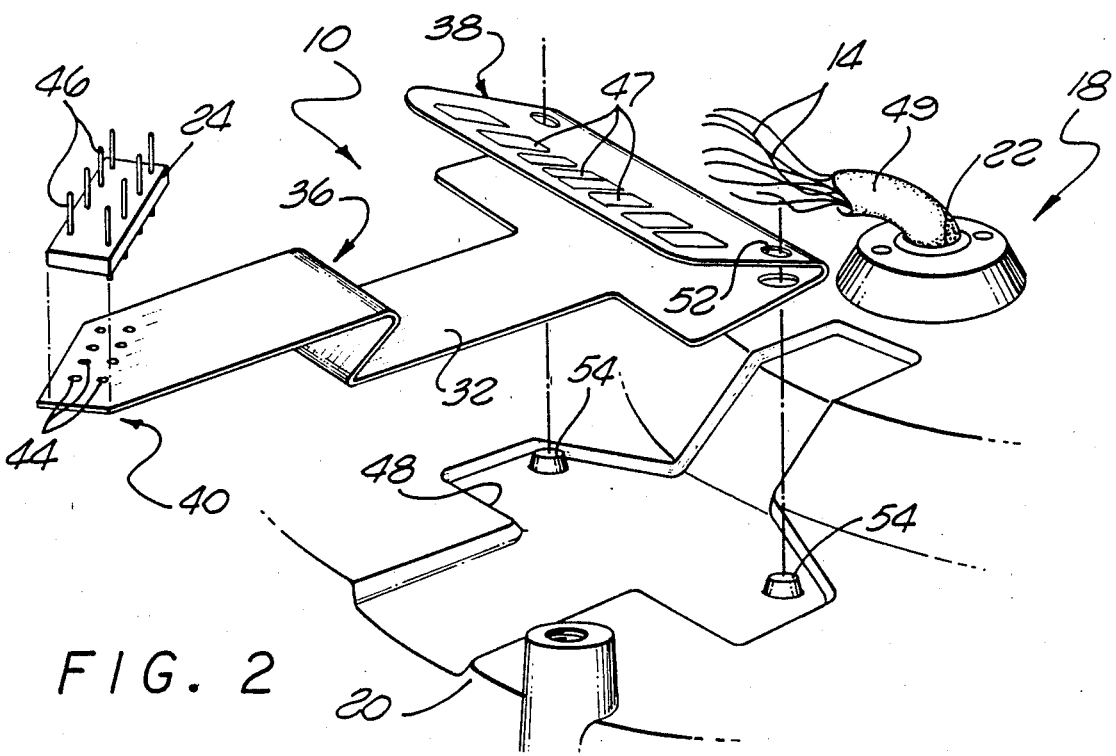
FIG. 2 is an enlarged fragmented and exploded perspective view illustrating mounting of the spindle motor flex cable of the disk drive unit.
Figure 3:
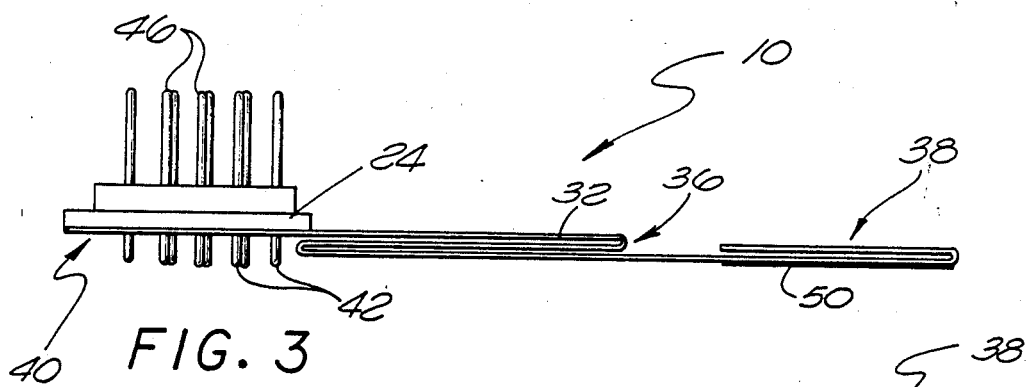
FIG. 3 is a side elevational view of the spindle motor flex cable.
Figure 4:
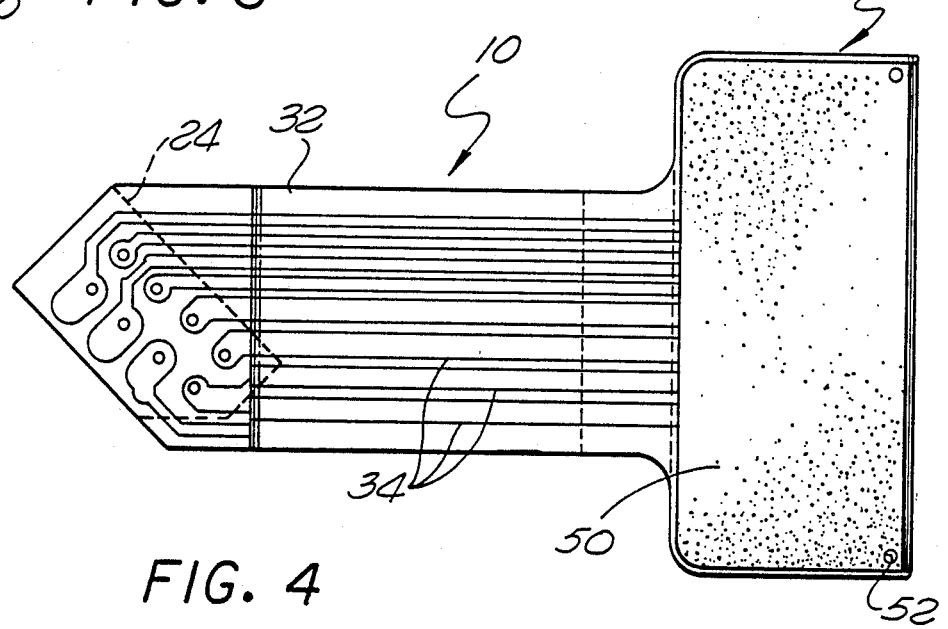
FIG. 4 is a bottom plan view of the spindle motor flex cable.
Figure 5:
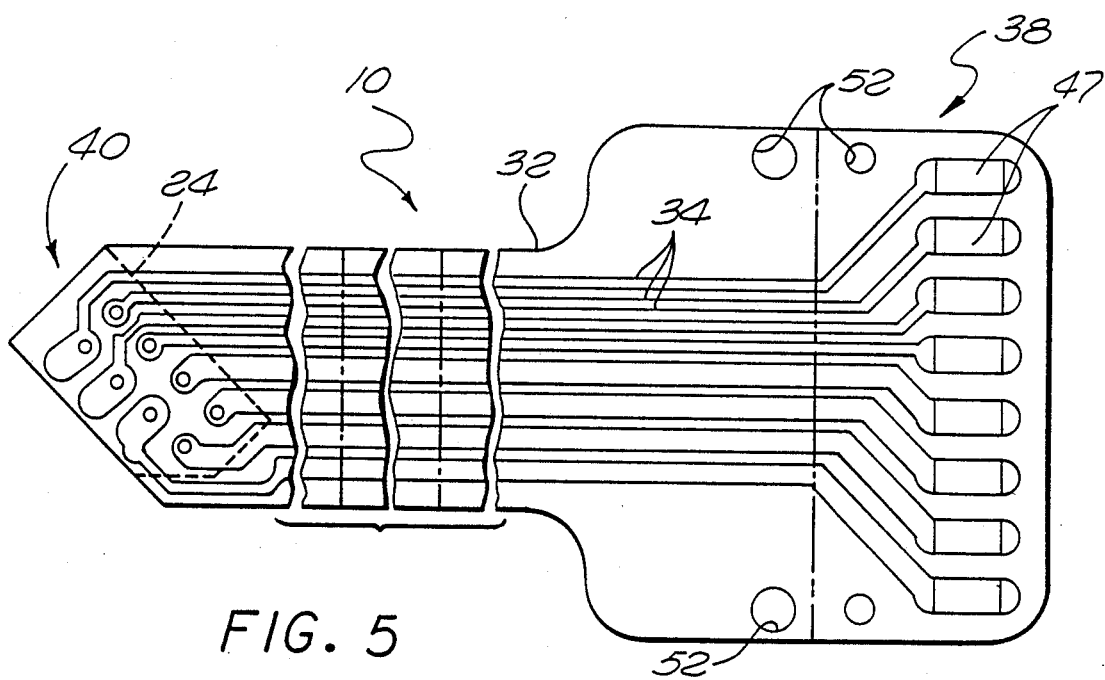
FIG. 5 is an enlarged, developed bottom plan view of the spindle motor flex cable.

As shown best in FIG. 2, the flex cable 10 is installed relative to the disk drive housing 18 at the underside of the housing with an inboard end segment 38 disposed in close proximity with the spindle motor leads 14. The flex cable 10 is oriented with its conductor side presented toward the disk drive housing 18. The flex cable has sufficient length to position an outboard end segment 40 at least slightly beyond a side margin of the disk drive housing 18. Accordingly, outboard ends of the conductors 34 are upwardly exposed at the side of the housing 18 for easy access with a soldering tool (not shown) or the like to attach the connector fitting 24. As shown in FIGS. 2-5, such attachment is achieved by soldering terminal pins 42 on the connector fitting 24 to the individual conductors 34 upon receiving the terminal pins 42 through preformed ports 44 in the flex cable. The fitting 24 is thus conveniently mounted at the underside of the flex cable for downward presentation of connector prongs 46 or the like adapted to mate with the fitting 26 on the circuit board 28.

Orientation of the flex cable 10 with the conductor side facing the disk drive housing 18 is normally incompatible with facilitated connection to the spindle motor leads 14. However, in accordance with a primary aspect of the present invention, the inboard end segment 38 of the flex cable 10 is folded back upon itself to reorient the inboard ends of the conductors 34 to face away from the disk drive housing 18, as viewed in FIG. 2. These inboard ends of the conductors terminate in terminal pads 47 of a sufficiently large size and shape to accommodate relatively quick and easy connection to the individual spindle motor leads 14 by soldering or the like. Once again, the easy access to the inboard ends of the conductors 34 permits this soldering to proceed by means of manual or automated processes. A resilient sleeve 49 may be used to collect the leads 14 into a convenient bundle.

In accordance with further aspects of the invention, accurate location of the flex cable 10 on the disk drive housing 18 is facilitated by the use of locating means such as a shaped recess 48 formed on the disk drive housing to receive the inboard end segment 38. A preferred flex cable construction includes a layer 50 (FIG. 4) of pressure sensitive adhesive or the like near the inboard end segment 38 of the cable for securely mounting the cable to the disk drive housing. Additionally, locator ports 52 may be formed in the flex cable 10 for receiving locator posts 54 on the housing 18 to position the cable quickly yet accurately relative to the adjacent spindle motor leads 14.

The improved spindle motor flex cable 10 thus provides a relatively simple and easily manipulated component for quickly coupling the spindle motor leads 14 of a disk drive unit to appropriate drive electronics 16. The flex cable 10, including the folded back inboard end segment 38, accommodates rapid solder connection or the like to the adjacent components in a manner suitable for automated manufacturing processes, if desired.

A variety of modifications and improvements to the spindle motor flex cable of the present invention will be apparent to those skilled in the art. Accordingly, no limitation on the invention is intended by way of the foregoing description or the accompanying drawings, except as set forth in the appended claims.

What is claimed is:

1. In combination:
    a disk drive unit including a housing, a spindle motor mounted within said housing, a plurality of spindle motor leads coupled to said spindle motor and protruding from said housing, and drive electronics for controlling operation of said spindle motor;
    a spindle motor flex cable defined by a substantially flat ribbon cable base having first and second ends and a plurality of conductors carried by said cable base on one side thereof to extend generally between said first and second ends;
    means for supporting said ribbon cable based relative to said housing with said one side of said cable base presented generally toward said housing, said conductors being connected respectively at said first and second ends to said spindle motor leads and to said drive electronics, said first end of said ribbon cable base including a first end segment folded back upon itself to reorient said conductors at said first end segment for presentation away from said housing;
    said housing defining a shallow recess for seated reception of a portion of said ribbon cable base adjacent to said first end segment to position said first end segment predeterminably with respect to said housing; and
    adhesive means on said portion of said ribbon cable base adjacent to said first end segment, on said one side of said ribbon cable, for securing said portion to said housing within said recess.

2. The combination of claim 1 wherein said ribbon cable base includes an intermediate fold to permit longitudinal extension and retraction of said ribbon cable base.

3. The combination of claim 1 wherein said second end of said ribbon cable base is disposed at least slightly beyond a side margin of said housing.

4. The combination of claim 1 wherein said housing has a locator post thereon within said recess, and wherein said portion of said ribbon cable base adjacent to said end segment has at least one port formed therein for reception of said locator post.

5. The combination of claim 1 further including a first connector fitting carried by said ribbon cable base at said second end thereof, and a second connector fitting coupled with said drive electronics and adapted for mating engagement with said first connector fitting, said first connector fitting including connector means presented in a direction away from said housing.

* * * * *